United States Patent
Wu et al.

(10) Patent No.: US 10,644,695 B1
(45) Date of Patent: May 5, 2020

(54) SOURCE DRIVER

(71) Applicant: Novatek Microelectronics Corp., Hsinchu (TW)

(72) Inventors: Han-Kun Wu, Hsinchu (TW); Pang-Chen Hung, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/527,030

(22) Filed: Jul. 31, 2019

Related U.S. Application Data (60) Provisional application No. 62/794,557, filed on Jan. 19, 2019.

(51) Int. Cl.
*H03B 1/00* (2006.01)
*H03K 3/00* (2006.01)
*H03K 17/22* (2006.01)
*G09G 3/20* (2006.01)

(52) U.S. Cl.
CPC ............ *H03K 17/223* (2013.01); *G09G 3/20* (2013.01); *G09G 2310/0275* (2013.01); *G09G 2310/0291* (2013.01); *G09G 2320/0257* (2013.01); *G09G 2330/026* (2013.01); *G09G 2330/027* (2013.01)

(58) Field of Classification Search
CPC ............... H03K 17/223; G09G 3/20; G09G 2320/0257; G09G 2330/026; G09G 2310/0291; G09G 2310/0275; G09G 2330/027
USPC ......................................................... 327/108
See application file for complete search history.

(56) References Cited

U.S. PATENT DOCUMENTS

| | | | |
|---|---|---|---|
| 2007/0069929 A1* | 3/2007 | Mallinson | H03M 3/344 341/143 |
| 2013/0169617 A1* | 7/2013 | Cheng | G09G 3/36 345/212 |
| 2015/0014712 A1* | 1/2015 | Kim | G09G 3/3688 257/88 |

* cited by examiner

*Primary Examiner* — Metasebia T Retebo
(74) *Attorney, Agent, or Firm* — JCIPRNET (57) ABSTRACT

A source driver is proposed. The source driver includes N output buffers, (N−1) switches, a first auxiliary switch, a second auxiliary switch, and a third auxiliary switch. The (N−1) switches are respectively coupled between N output terminals of the N output buffers. The first auxiliary switch is coupled between a first output terminal among the N output terminals of the N output buffers and a first endpoint. The second auxiliary switch is coupled between the first output terminal and a second endpoint. The third auxiliary switch is coupled between the first output terminal and a third endpoint. Each of the first endpoint, the second endpoint, and the third endpoint receives a first fixed voltage, a second fixed voltage, a third fixed voltage, or is in a floating state.

13 Claims, 4 Drawing Sheets

SOURCE DRIVER

CROSS-REFERENCE TO RELATED APPLICATION

This application claims the priority benefit of U.S. provisional application Ser. No. 62/794,557, filed on Jan. 19, 2019. The entirety of the above-mentioned patent application is hereby incorporated by reference herein and made a part of this specification.

BACKGROUND

Field of the Invention

The invention relates to a source driver and more particularly, to a universal type source driver.

Description of Related Art

When a display is powered on or powered off, an afterimage usually appear on a screen of the display as charges still remain in capacitors of a display circuit, which affects display quality. In currently available techniques, all output terminals of a source driver of the display are short-connected together, or short-connected together and coupled to a fixed voltage when the display is powered on or powered off, such that potentials of the capacitors of the display circuit are stable and the same to eliminate the afterimage issue of the display screen.

However, difference types of displays use different methods to eliminate the afterimage. In some types of displays, all the output terminals of the source driver have to be coupled to a common voltage when the display is powered off. In some types of displays, all the output terminals of the source driver have to be coupled to the common voltage when the display is powered on. Yet, in some types of displays, all the output terminals of the source driver have to be coupled to a ground voltage when the display is powered on. Thus, a person skilled in the art have to design difference versions of source drivers for different types of displays. In other words, there is no source driver that can be universally applied in all types of displays.

SUMMARY

The invention provides a source driver capable of effectively eliminating an afterimage issue of a display when the display is powered on or powered off, and the source driver of the invention may be universally applied in various types of displays.

A source driver of the invention includes N output buffers, (N−1) switches, a first auxiliary switch, a second auxiliary switch, and a third auxiliary switch. The (N−1) switches are respectively coupled between N output terminals of the N output buffers. The first auxiliary switch is coupled between a first output terminal among the N output terminals of the N output buffers and a first endpoint. The second auxiliary switch is coupled between the first output terminal and a second endpoint. The third auxiliary switch is coupled between the first output terminal and a third endpoint. Each of the first endpoint, the second endpoint, and the third endpoint receives a first fixed voltage, a second fixed voltage, a third fixed voltage, or is in a floating state.

Based on the above, the source driver of the invention is configured to include the first auxiliary switch, the second auxiliary switch, the third auxiliary switch, the first endpoint, the second endpoint and the third endpoint and configures each of the first endpoint, the second endpoint and the third endpoint to receive the first fixed voltage, the second fixed voltage, the third fixed voltage, or to be in the floating state. In this way, all the output terminals of the source driver can be short-connected together, or short-connected together and coupled to the first fixed voltage, the second fixed voltage and the third fixed voltage when the display is powered on or powered off to avoid the afterimage issue on of the display screen. Moreover, the source driver of the invention can be universally applied in various types of displays.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
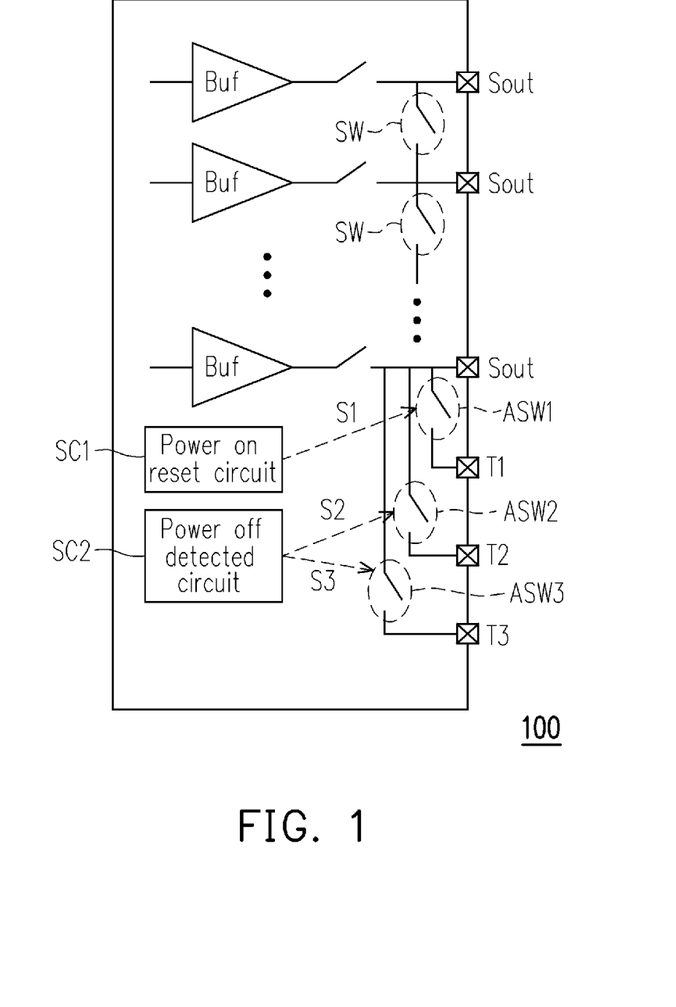
FIG. 1 is a schematic diagram of a source driver according to an embodiment of the invention.

FIG. 1 is a schematic diagram of a source driver 100 according to an embodiment of the invention. The source driver 100 of the invention may be applied in a display (which is not shown) in a form of integrated circuit. Referring to FIG. 1, the source driver 100 includes N output buffers Buf, (N−1) switches SW, a first auxiliary switch ASW1, a second auxiliary switch ASW2, and a third auxiliary switch ASW3. N is a positive integer greater than 1.

N output terminals Sout of the N output buffers Buf of the source driver 100 output a data voltage to a pixel circuit (which is not shown) of the display. The (N−1) switches SW are present between the N output terminals Sout. The first auxiliary switch ASW1 is coupled between one of the output terminals (which is referred to as a first output terminal hereinafter) of one of the output buffers Buf and a first endpoint T1. For instance, the first output terminal may be the output terminal of the Nth output buffer Buf, and the first endpoint T1 is configured to receive a fixed voltage (which is referred to as a first fixed voltage hereinafter) or to be in a floating state. The second auxiliary switch ASW2 is coupled between the first output terminal and a second endpoint T2, and the second endpoint T2 is configured to receive a fixed voltage (which is referred to as a second fixed voltage hereinafter) or to be in a floating state. The third auxiliary switch ASW3 is coupled between the first output terminal and a third endpoint T3, and the third endpoint T3 is configured to receive a fixed voltage (which is referred to as a third fixed voltage hereinafter) or to be in a floating state.

Each of the first fixed voltage, the second fixed voltage and the third fixed voltage may be selected from a half-operating voltage, a common voltage and a ground voltage based on a design requirement. A voltage value of the half-operating voltage is half of a voltage value of an operating voltage of the source driver 100, and a voltage value of the common voltage is between the half-operating voltage and the ground voltage. The first fixed voltage, the second fixed voltage and the third fixed voltage may be provided by an internal voltage source of the source driver 100 or an external voltage source (which is not shown) of the source driver 100.

In a small period of time after the internal voltage source is turned on, the (N−1) switches SW and the first auxiliary switch ASW1 are turned on, such that the N output terminals Sout are short-connected together and floated via the first endpoint T1 or receive the first fixed voltage. Similarly, in a small period of time after the internal voltage source is turned off, the (N−1) switches SW, the second auxiliary switch ASW2 and the third auxiliary switch ASW3 are turned on, such that the N output terminals Sout are short-connected together and simultaneously receive the second fixed voltage and the third fixed voltage. Alternatively, the N output terminals Sout are short-connected together and receive the second fixed voltage (while the third endpoint T3 is floated at this time). Or, furthermore, the N output terminals Sout are short-connected together and receive the third fixed voltage (while the second endpoint T2 is floated at this time). In this way, potentials of the N output terminals Sout may be the same as each other and stable during a transition period that the internal voltage source is changed, so as to eliminate residual charges of capacitors of a display circuit (which is not shown), or keep an amount of the charges of the capacitors of the display circuit in consistency, thereby avoiding the afterimage issue of the display when the display is powered on or powered off.

In the present embodiment, the source driver 100 is disposed on an integrated circuit, the first endpoint T1, the second endpoint T2 and the third endpoint T3 are respectively disposed on three pads on the integrated circuit. The three pads may receive the external voltage source of the source driver 100 via a wiring on the circuit board. Moreover, a person skilled in the art may configure voltage values of the first fixed voltage, the second fixed voltage, the third fixed voltage based on a design requirement, or set the first endpoint T1, the second endpoint T2 and the third endpoint T3 to float.

In an embodiment, the first fixed voltage received by the first endpoint T1 and the second fixed voltage of the second endpoint T2 may be half-operating voltages, and the third endpoint T3 is floated.

In an embodiment, the first fixed voltage received by the first endpoint T1 may be a half-operating voltage, the second fixed voltage of the second endpoint T2 may be a ground voltage, and the third endpoint may be floated or receive a ground voltage.

In an embodiment, both the first fixed voltage received by the first endpoint T1 and the second fixed voltage of the second endpoint T2 may be common voltages, and the third fixed voltage received by the third endpoint T3 may be a ground voltage.

In an embodiment, the first fixed voltage received by the first endpoint T1 may be a ground voltage, the second fixed voltage of the second endpoint T2 may be a common voltage, and the third fixed voltage received by the third endpoint T3 may be a ground voltage.

In an embodiment, the first endpoint T1 may be floated, the second fixed voltage received by the second endpoint T2 may be a common voltage, and the third fixed voltage received by the third endpoint T3 may be a ground voltage.

In an embodiment, both the first endpoint T1 and the second endpoint T2 receive a ground voltage, and the third endpoint may be floated or receive a ground voltage.

In an embodiment, the first endpoint T1 may be floated, the second endpoint T2 may receive a ground voltage, and the third endpoint may be floated or receive a ground voltage.

In an embodiment, the first endpoint T1, the second endpoint T2 and the third endpoint T3 may be all floated.

In the embodiments described above, when the first fixed voltage and the second fixed voltage are the same, the first endpoint T1 may be coupled to the second endpoint T2 through a circuit on the circuit board. When the second fixed voltage and the third fixed voltage are the same, the second endpoint T2 may be coupled to the third endpoint T3 through the circuit on the circuit board.

Continuously referring to FIG. 1, the turning on or turning off of the first auxiliary switch ASW1 is controlled by a first signal S1, and the turning on or turning off of the second auxiliary switch ASW2 and the third auxiliary switch ASW3 is controlled by a second signal S2. A power on reset circuit SC1 is configured to send the first signal S1 (i.e., a reset signal) when the internal voltage source is turned on, so as to reset potentials of a plurality of electronic components of the source driver 100. A power off detection circuit SC2 is configured to send the second signal S2 when the internal voltage source is turned off, so as to turn on the second auxiliary switch ASW2 and the third auxiliary switch ASW3. In an embodiment, the first auxiliary switch ASW1, the second auxiliary switch ASW2 and the third auxiliary switch ASW3 are switches formed by transistors. Implementation details related to the power on reset circuit SC1 and the power off detection circuit SC2 will described later below.

Figure 2:
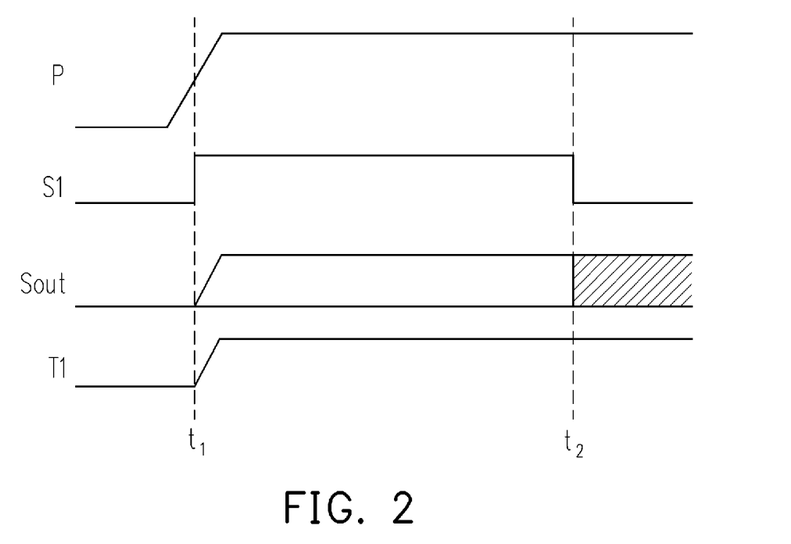
FIG. 2 is a schematic waveform diagram of the source driver after the internal voltage source is turned on according to an embodiment of the invention.

FIG. 2 is a schematic waveform diagram of the source driver 100 after the internal voltage source is turned on according to an embodiment of the invention. Referring to FIG. 2, in order to clearly show a waveform change of the output terminals Sout before and after a time point t1, the waveform of the output terminals Sout is illustrated as at a low potential before the time point t1, however, actually, the potential of the output terminals Sout before the time point t1 is in an unknown state. At the time point t1, the power on reset circuit SC1 detects that an internal voltage source P is powered on, an output (the first signal S1) of the power on reset circuit SC1 is transferred from a low potential to a high potential. In this circumstance, the first endpoint T1 receives the first fixed voltage (or is floated), such that the N output terminals Sout of the N output buffers Buf are connected together and fixed to the first fixed voltage (or another voltage caused by the floating of the first endpoint T1). The first signal S1 is sent out at the time point t1 and maintained until a time point t2, and thus, between the time point t1 and the time point t2, the output terminals Sout and the first endpoint T1 have the same potential. After the time point t2, the switches SW between the output terminals Sout are turned off, the output terminals Sout start to normally output a data voltage (presented by oblique lines in FIG. 2), and the potential of the first endpoint T1 is still maintained at the first fixed voltage (or another voltage caused by the floating of the first endpoint T1).

Figure 3:
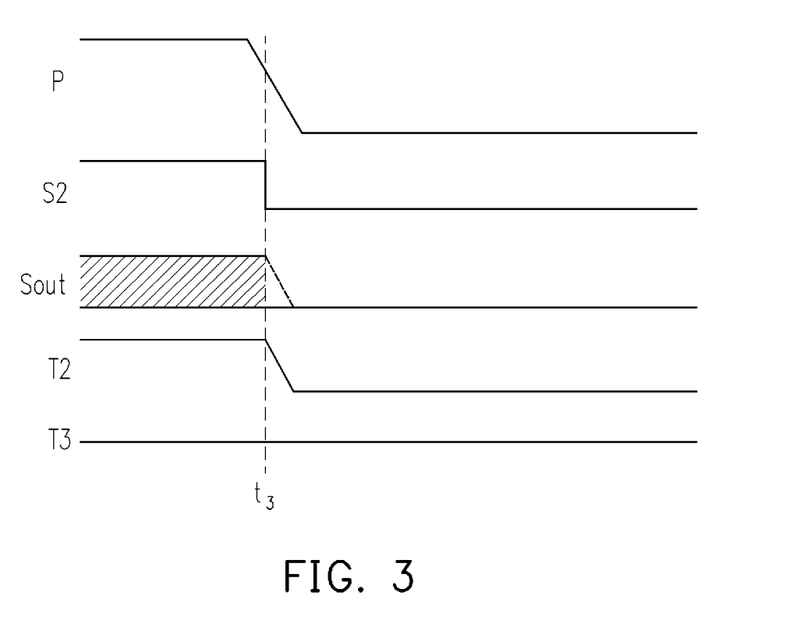
FIG. 3 is a schematic waveform diagram of the source driver after the internal voltage source is turned off according to an embodiment of the invention.

FIG. 3 is a schematic waveform diagram of the source driver 100 after the internal voltage source is turned off according to an embodiment of the invention. Referring to FIG. 3, before a time point t3, the output terminals Sout normally output the data voltage (presented by oblique lines in FIG. 3). At the time point t3, the power off detection circuit SC2 detects that the internal voltage source P is turned off, and an output (the second signal S2) of the power off detection circuit SC2 is transferred from a high potential to a low potential. When the second signal S2 is transferred to the low potential, the common voltage of the second endpoint T2 is dropped down to a ground voltage by the ground voltage of the third endpoint T3, such that the voltage of the N output terminals Sout of the N output buffers Buf are dropped down from the common voltage to the ground voltage. Thus, after the time point t3, the voltage of the output terminals Sout are maintained at the ground voltage.

Figure 4:
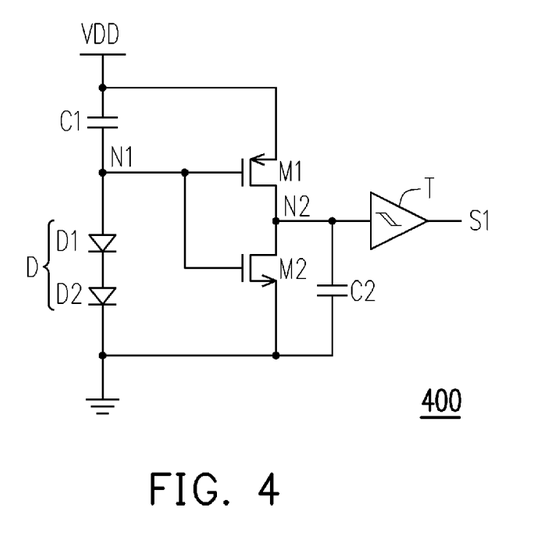
FIG. 4 is a schematic circuit diagram of a power on reset circuit according to an embodiment of the invention.

FIG. 4 is a schematic circuit diagram of a power on reset circuit 400 according to an embodiment of the invention. Referring to FIG. 4, the power on reset circuit 400 includes a first capacitor C1, a second capacitor C2, a diode string D, a first transistor M1, a second transistor M2 and a comparator T. A first terminal of the capacitor C1 is coupled to an operating voltage VDD, a second terminal of the first capacitor C1 is coupled to a first terminal of the diode string D, and a second terminal of the diode string D is coupled to a first reference ground voltage. In an embodiment, the diode string D may include a diode D1 and a diode D2. Both the diode D1 and the diode D2 may have forward bias voltages and may be connected in series with each other. In other embodiments, the number of the diodes included by the diode string D may be one, two or more. A first terminal of the first transistor M1 is coupled to the operating voltage VDD, a second terminal of the first transistor M1 is coupled to a first terminal of the second transistor M2, the second terminal of the second transistor M2 is coupled to the first reference ground voltage, and control terminals of the first transistor M1 and the second transistor M2 are coupled to a node N1. The node N1 is located between the second terminal of the first capacitor C1 and the first terminal of the diode string D. An input terminal of the comparator T is coupled to a node N2. The node N2 is located between the second terminal of the first transistor M1 and the first terminal of the second transistor M2. An output terminal of the comparator T outputs the first signal S1. A first terminal of the second capacitor C2 is coupled to the input terminal of the comparator T, and the first terminal of the second capacitor C2 is coupled to the first reference ground voltage. In the present embodiment, both the first capacitor C1 and the second capacitor C2 are transistor capacitors, and the diode D1 and the diode D2 are formed by a plurality of transistors.

When the operating voltage VDD starts to raise, the first transistor M1 turned off, and the second transistor M2 is turned on. In this circumstance, the node N2 is at a low potential, which causes the output of the comparator T to be a low potential. When the operating voltage VDD continues to raise, the first transistor M1 is also turned on, such that the second capacitor C2 starts to be charged. In this circumstance, the node N2 is at a high potential, which causes the output of the comparator T to be a high potential. In this way, as the operating voltage VDD gradually raises, an output (i.e., the first signal S1) of the power on reset circuit 400 is first maintained at a low potential for a period of time and then gradually transferred to a high potential, thereby achieving a purpose of sending the reset signal following the turning on of the operating voltage VDD. In the present embodiment, the comparator T may be a Schmitt trigger. The structure and application of the Schmitt trigger have been well known to the person skilled in the art and thus, will not be repeatedly described.

Figure 5:
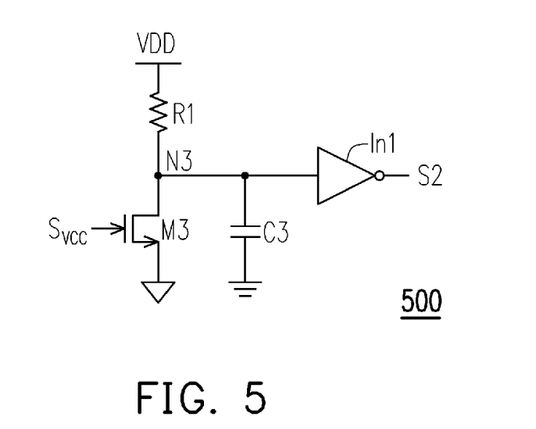
FIG. 5 is a schematic circuit diagram of a power off detection circuit according to an embodiment of the invention.

FIG. 5 is a schematic circuit diagram of a power off detection circuit 500 according to an embodiment of the invention. Referring to FIG. 5, the power off detection circuit 500 includes a first resistor R1, a third transistor M3, a third capacitor C3 and a first inverter In1. A first terminal of the first resistor R1 is coupled to a reference voltage VDD, a second terminal of the first resistor R1 is coupled to a first terminal of the third transistor M3, a second terminal of the third transistor M3 is coupled to a second reference ground voltage, and a control terminal of the third transistor M3 is coupled to an internal voltage source detection voltage $S_{VCC}$. The internal voltage source detection voltage $S_{VCC}$ is provided by the internal voltage source detection circuit. A first terminal of the third capacitor C3 is coupled to a node N3, and a second terminal of the third capacitor C3 is coupled to the first reference ground voltage. The node N3 is located between a second terminal of the first resistor R1 and the first terminal of the third transistor M3. An input terminal of the first inverter In1 is coupled to the node N3, and an output terminal of the first inverter In1 outputs the second signal S2. In the present embodiment, the first resistor R1 is a transistor resistor, and the third capacitor C3 is a transistor capacitor.

When the internal voltage source detection voltage $S_{VCC}$ is at a high potential (i.e., detects the internal voltage source), the third transistor M3 is turned on, such that a potential of the node N3 is pulled down to the second reference ground voltage. Thus, the first inverter In1 outputs a high potential according to the potential of the node N3. By contrast, when the internal voltage source detection voltage $S_{VCC}$ is at a low potential (i.e., does not detect the internal voltage source), the third transistor M3 is not turned on, and the third capacitor C3 starts to store electric energy, such that the potential of the node N3 is pulled up to a high potential. Thus, the first inverter In1 outputs a low potential according to the potential of the node N3. In this way, the power off detection circuit SC2 may achieve a purpose of detecting whether the internal voltage source P is turned off.

Figure 6:
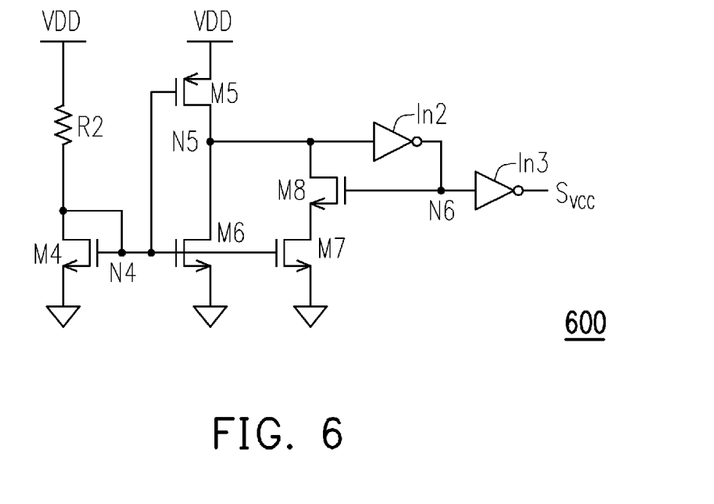
FIG. 6 is a schematic circuit diagram of an internal voltage source detection circuit according to an embodiment of the invention.

FIG. 6 is a schematic circuit diagram of an internal voltage source detection circuit according to an embodiment of the invention. Referring to FIG. 6, an internal voltage source detection circuit 600 is configured to provide the internal voltage source detection voltage $S_{VCC}$. The internal voltage source detection circuit 600 includes a second resistor R2, a fourth transistor M4, a fifth transistor M5, a sixth transistor M6, a seventh transistor M7, an eighth transistor M8, a second inverter In2 and a third inverter In3. A first terminal of the second resistor R2 is coupled to the reference voltage, a second terminal of the second resistor R2 is coupled to a drain terminal of the fourth transistor M4, and a source terminal of the fourth transistor M4 is coupled to the second reference ground voltage. A source terminal of the fifth transistor M5 is coupled to the reference voltage, a drain terminal of the fifth transistor M5 is coupled to a drain terminal of the sixth transistor M6, and a source terminal of the sixth transistor M6 is coupled to the second reference ground voltage. A drain terminal of the eighth transistor M8 is coupled to a node N5, a source terminal of the eighth transistor M8 is coupled to a drain terminal of the seventh transistor M7, and a source terminal of the seventh transistor M7 is coupled to the second reference ground voltage. The node N5 is located between the drain terminal of the fifth transistor M5 and the drain terminal of the sixth transistor M6. Gate terminals of the fourth transistor M4, the fifth transistor M5, the sixth transistor M6 and the seventh transistor M7 are coupled to a node N4. The node N4 is coupled to the drain terminal of the fourth transistor M4. An input terminal of the second inverter In2 is coupled to the node N5, and an output terminal of the second inverter In2 is coupled to a node N6. The node N6 is coupled to a control terminal of the eighth transistor M8. An input terminal of the third inverter In3 is coupled to the node N6, and an output terminal of the third inverter In3 outputs the internal voltage source detection voltage $S_{VCC}$.

The fourth transistor M4 and the sixth transistor M6 form a current mirror, and a mirror current flows through the node N5. The fifth transistor M5 and the sixth transistor M6 form an inverter, such that a potential of the node N5 is inverse to a potential of the node N4. When the reference voltage is at a high level, the fourth transistor M4 is turned on. In this circumstance, the node N4 is at a low level, a level of the node N5 is inverted to be high, and a level of the node N6 is inverted to be low, such that a level of the internal voltage source detection voltage $S_{VCC}$ is inverted to be high. By contrast, when the reference voltage is at a low level, the fourth transistor M4 is turned off. In this circumstance, the node N4 is at a high level, the level of the node N5 is inverted to be low, and the level of the node N6 is inverted to be high, such that the level of the internal voltage source detection voltage $S_{VCC}$ is inverted to be low. Additionally, the eighth transistor M8 and the seventh transistor M7 are capable of clamping when the node N6 is at the high level. When the node N6 is at the high level, both the eighth transistor M8 and the seventh transistor M7 are turned on, thereby clamping the node N5 at a low potential. When the node N6 is at the high level, the eighth transistor M8 is turned off. In this way, the internal voltage source detection circuit 600 may provide the internal voltage source detection voltage $S_{VCC}$ to achieve a purpose of detecting the internal voltage source.

In the above embodiments, both the second auxiliary switch ASW2 and the third auxiliary switch ASW3 are controlled by the second signal S2 indicating that the internal voltage source is turned off. For example, the power off detection circuit SC2 sends the second signal S2 when detecting that the internal voltage source is turned off, so as to simultaneously turn on the second auxiliary switch ASW2 and the third auxiliary switch ASW3.

In another embodiment, the second auxiliary switch ASW2 may be controlled by the second signal S2 indicating that the internal voltage source is turned off, and the third auxiliary switch ASW3 is controlled by a third signal S3 indicating that the internal voltage source is turned off, and the voltage of the N output terminals is dropped down to the common voltage. Specifically, the second endpoint T2 is connected to the common voltage, and the third endpoint T3 is connected to the ground voltage. When the second auxiliary switch ASW2 is turned on by the second signal S2 and causes the potential of the output terminals Sout to be dropped down to the common voltage, the third auxiliary switch ASW3 may be turned on by the third signal S3 sent by the common voltage detection circuit, such that the potentials of each of the output terminals Sout is further dropped down to the ground voltage. The details related to the generation of the second signal S2 has been described above and thus, will not be repeated. In the present embodiment, the source driver may further include a common voltage detection circuit configured to detect whether the voltage of the output terminals Sout is dropped down to the common voltage when the display is powered off. Specifically, the common voltage detection circuit may be enabled by the second signal S2. In addition, the common voltage detection circuit may be integrated in the power off detection circuit, or stand alone outside the power off detection circuit.

Figure 7:
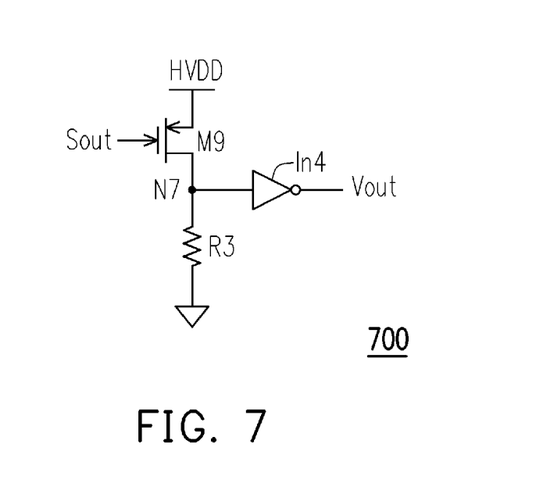
FIG. 7 is a schematic circuit diagram of a common voltage detection circuit according to an embodiment of the invention.

FIG. 7 is a schematic circuit diagram of a common voltage detection circuit according to an embodiment of the invention. Referring to FIG. 7, a common voltage detection circuit 700 includes a ninth transistor M9, a third resistor R3 and a fourth inverter In4. A first terminal of the ninth transistor M9 is coupled to a half-operating voltage HVDD, a second terminal of the ninth transistor M9 is coupled to a first terminal of the third resistor R3, and the ninth transistor M9 is controlled by the voltage of the output terminals Sout. Specifically, a control terminal of the ninth transistor M9 may receive an input voltage, while the input voltage may be a voltage of a second output terminal among the N output terminals. A second terminal of the third resistor R3 is coupled to the second reference ground voltage. An input terminal of the fourth inverter In4 is coupled to the second terminal (i.e., a node N7) of the ninth transistor M9, and an output terminal of the fourth inverter In4 outputs an output voltage.

When the input voltage is high-level (e.g., a half-operating voltage), the ninth transistor M9 is turned off, the node N7 is at a low level, an output voltage Vout is inverted to be at a high level. By contrast, when the input voltage is dropped down (e.g., to the common voltage voltage), the ninth transistor M9 is turned on, the node N7 is at a high level, and the output voltage Vout is inverted to be at a low level. When the output voltage Vout is low-level, the third auxiliary switch ASW3 receives the third signal S3 and is turned on, such that the potential of each of the output terminals Sout is dropped down from the common voltage to the ground voltage. In this way, the common voltage detection circuit 700 may achieve a purpose of detecting whether the potential of each of the output terminals Sout is dropped down to the common voltage, so as to send the third signal S3 to turn on the third auxiliary switch ASW3.

In the present embodiment, the capacitors, the diode string and the comparator illustrated in FIG. 4 may all be formed by transistors. Similarly, the resistors, the capacitors and the inverter illustrated in FIG. 5 may all be formed by transistors. The resistors and the inverters illustrated in FIG. 6 may all be formed by transistors. The resistors and the inverter illustrated in FIG. 7 may all be formed by transistors.

In light of the foregoing, the source driver of the invention is configured to include the first auxiliary switch, the second auxiliary switch, the third auxiliary switch, the first endpoint, the second endpoint and the third endpoint, such that the output terminals of the output buffers of the source driver can be short-connected together and floated, or short-connected together and connected to a fixed voltage when the display is powered on or powered off according to design requirements, thereby avoiding the afterimage issue on the display screen. Moreover, the source driver of the invention can be universally applied in various types of displays.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A source driver, comprising:
   N output buffers, wherein N is a positive integer greater than 1;
   (N−1) switches, respectively coupled between N output terminals of the N output buffers;
   a first auxiliary switch, coupled between a first output terminal among the N output terminals of the N output buffers and a first endpoint;
   a second auxiliary switch, coupled between the first output terminal and a second endpoint; and
   a third auxiliary switch, coupled between the first output terminal and a third endpoint,
   wherein each of the first endpoint, the second endpoint, and the third endpoint receives a first fixed voltage, a second fixed voltage, a third fixed voltage, or is in a floating state,
   wherein the (N−1) switches and the first auxiliary switch are controlled by a first signal indicating that an internal voltage source of the source driver is turned on, and the (N−1) switches and the second auxiliary switch are controlled by a second signal indicating that the internal voltage source of the source driver is turned off.

2. The source driver according to claim 1, wherein the source driver is disposed on an integrated circuit, the first endpoint, the second endpoint and the third endpoint are respectively disposed on a plurality of pads on the integrated circuit.

3. The source driver according to claim 1, wherein each of the first fixed voltage, the second fixed voltage and the third fixed voltage is provided by the internal voltage source of the source driver or an external voltage source of the source driver.

4. The source driver according to claim 1, wherein each of the first fixed voltage, the second fixed voltage and the third fixed voltage is selected from a half-operating voltage, a common voltage and a ground voltage, wherein a voltage value of the half-operating voltage is half of a voltage value of an operating voltage of the source driver.

5. The source driver according to claim 1, wherein the (N−1) switches, the second auxiliary switch and the third auxiliary switch are controlled by the second signal indicating that the internal voltage source of the source driver is turned off.

6. The source driver according to claim 1, wherein the (N−1) switches and the third auxiliary switch are controlled by a third signal, wherein the third signal indicates that the internal voltage source is turned off and a voltage of the N output terminals is dropped down to a common voltage.

7. The source driver according to claim 5, further comprising:
   a power on reset circuit, configured to send a reset signal when the internal voltage source is turned on, wherein the reset signal serves as the first signal.

8. The source driver according to claim 7, wherein the power on reset circuit comprises:
   a first capacitor, having a first terminal receiving the internal voltage source;
   a diode string, having a first terminal coupled to a second terminal of the first capacitor and a second terminal coupled to a first reference ground voltage;
   a first transistor, having a first terminal receiving the internal voltage source and a control terminal coupled to a second terminal of the first capacitor;
   a second transistor, having a first terminal coupled to a second terminal of the first transistor, a second terminal coupled to the first reference ground voltage and a control terminal coupled to the second terminal of the first capacitor;
   a comparator, having an input terminal coupled to the second terminal of the first transistor and an output terminal outputting the reset signal; and
   a second capacitor, having a first terminal coupled to the input terminal of the comparator and a second terminal coupled to the first reference ground voltage.

9. The source driver according to claim 8, wherein the diode string comprises a plurality of diodes formed by a plurality of transistors, and the diodes are coupled in series with each other.

10. The source driver according to claim 5, further comprising:
    a power off detection circuit, configured to send the second signal when the internal voltage source is turned off.

11. The source driver according to claim 10, wherein the power off detection circuit comprises:
    a first resistor, having a first terminal coupled to a reference voltage;
    a third transistor, having a first terminal coupled to a second terminal of the first resistor, a second terminal coupled to a second reference ground voltage and a control terminal coupled to an internal voltage source detection voltage;
    a third capacitor, having a first terminal coupled to the second terminal of the first resistor and a second terminal coupled to the first reference ground voltage; and
    a first inverter, having a first terminal coupled to the first terminal of the third capacitor and a second terminal providing the second signal.

12. The source driver according to claim 11, wherein the internal voltage source detection voltage is generated by a power voltage detection circuit, and the power voltage detection circuit comprises:
    a second resistor, having a first terminal coupled to the reference voltage;
    a fourth transistor, having a first terminal coupled to the second terminal of the second resistor, a second terminal coupled to the second reference ground voltage and a control terminal coupled to the first terminal of the fourth transistor;
    a fifth transistor, having a first terminal coupled to the reference voltage and a control terminal coupled to the control terminal of the fourth transistor;
    a sixth transistor, having a first terminal coupled to a second terminal of the fifth transistor, a second terminal coupled to the second reference ground voltage and a control terminal coupled to the control terminal of the fourth transistor;
    a seventh transistor, having a second terminal coupled to the second reference ground voltage and a control terminal coupled to the control terminal of the fourth transistor;
    an eighth transistor, having a first terminal coupled to the second terminal of the fifth transistor and a second terminal coupled to the first terminal of the seventh transistor;

a second inverter, having a first terminal coupled to the first terminal of the eighth transistor and a second terminal coupled to a control terminal of the eighth transistor; and a third inverter, having a first terminal coupled to the second terminal of the second inverter and a second terminal providing the internal voltage source detection voltage.

13. The source driver according to claim 6, further comprising:

a common voltage detection circuit, configured to send the third signal when the internal voltage source is turned off and the voltage of the N output terminals is dropped down to the common voltage, wherein the common voltage detection circuit comprises:

a ninth transistor, having a first terminal coupled to the reference voltage and a control terminal receiving a voltage of a second output terminal among the N output terminals;

a third resistor, having a first terminal coupled to a second terminal of the ninth transistor and a second terminal coupled to the second reference ground voltage; and a fourth inverter, having an input terminal coupled to a second terminal of the ninth transistor and an output terminal outputting an output voltage.

\* \* \* \* \*